United States Patent [19]
Gaylord et al.

[11] Patent Number: 4,985,737
[45] Date of Patent: Jan. 15, 1991

[54] SOLID STATE QUANTUM MECHANICAL ELECTRON AND HOLE WAVE DEVICES

[75] Inventors: Thomas K. Gaylord; Kevin F. Brennan; Elias N. Glytsis, all of Atlanta, Ga.

[73] Assignee: Georgia Tech Research Corporation, Atlanta, Ga.

[21] Appl. No.: 272,175

[22] Filed: Nov. 16, 1988

[51] Int. Cl.$^5$ .............................................. H01L 27/12
[52] U.S. Cl. ........................................ 357/4; 357/16; 357/30; 357/58
[58] Field of Search ................ 357/16, 4, 30 E, 30 L, 357/58

[56] References Cited

U.S. PATENT DOCUMENTS 3,882,533  5/1975  Döhler .............................. 357/4 X

OTHER PUBLICATIONS

Fowler et al., "Planar Superlattice Structure", *IBM Technical Disclosure Bulletin*, vol. 12, No. 12, May 1970, pp. 2237–2237a.

Heiblum, "Ballistic Electrons and Holes Observed in a Semiconductor," *Optics News*, Oct. 1988, pp. 13–16.

Gaylord et al., "Semiconductor Superlattice Electron Wave Interference Filters", *Appl. Phys. Lett.*, 53(21), Nov. 21, 1988, pp. 2047–2049.

Thielen, "Design of Multilayer Interference Filters", *Physics of Thin Films*, vol. 5, ed. Hass et al., Academic Press, N.Y., 1969, pp. 47–87.

"Observation of Negative Differential Resistance in CHIRP Superlattices", by T. Nakagawa, H. Imamoto, T. Sakamoto, T. Kojima, K. Ohta, and N. J. Kawai, *Electronics Letters*, vol. 21, No. 19, Sep. 12, 1985, pp. 882–884.

"Transmission Line Analogy of Resonance Tunneling Phenomena: The Generalized Impedance Concept", by A. N. Khondker, M. R. Khan, and A. F. M. Anwar, *J. Appl. Phys.*, vol. 63, No. 10, May 15, 1988, pp. 5191–5193.

"Band-Pass Filters", Chapter 7, in *Thin-Film Optical Filters*, by H. A. Macleod, Macmillan Publishing Company, New York, 1986, pp. 234–257.

"The Resonant Hot Electron Transfer Amplifier: A Continuum Resonance Device", by C. S. Lent, *Superlattics and Microstructures*, Academic Press Limited, vol. 3, No. 4, 1987, pp. 387–389.

"Electron Wave Optics in Semiconductors", by T. K. Gaylord and K. F. Brennan, *J. Appl. Phys.* vol. 65, No. 2, Jan. 15, 1989, pp. 814–820.

"Resonant Tunneling Through Quantum Wells at Frequencies up to 2.5 THz", by T. C. L. G. Sollner, W. D. Goodhue, P. E. Tannenwald, C. D. Parker, and D. D. Peck, *Appl. Phys. Lett.*, vol. 43, No. 6, Sep. 15, 1983, pp. 588–590.

(List continued on next page.)

Primary Examiner—William Mintel
Attorney, Agent, or Firm—Michael B. Einschlag

[57] ABSTRACT

Solid state quantum mechanical electron or hole wave devices which are analogous to optical thin-film devices provide, among other things, energy selectivity for substantially ballistic electron or hole wave propagation in superlattice structures at energies above the superlattice potential energy barriers. Further, in accordance with the inventive method, the inventive devices may be designed by transforming existing optical thin-film design methods and existing optical interference filter designs into inventive semiconductor devices. This transformation from existing optical design methods and existing optical interference filter designs into semiconductor devices is performed for electron devices by mapping the optical phase index of refraction into a first solid state index of refraction for phase quantities which is proportional to the square root of the product of the electron kinetic energy and the electron effective mass and by mapping the optical amplitude index of refraction into a second solid state index of refraction for amplitude quantities which is proportional to the square root of the electron kinetic energy divided by the electron effective mass.

16 Claims, 2 Drawing Sheets

OTHER PUBLICATONS

"Design Principles for CHIRP Superlattice Devices", by T. Nakagawa, N. J. Kawai, and K. Ohta, *Superlattices and Microstructures*, Academic Press Inc. Limited, vol. 1, No. 2, 1985, pp. 187–192.

"Direct Observation of Ballistic Transport in GaAs", by M. Heiblum, M. I. Nathan, D. C. Thomas, and C. M. Knoedler, *Phs. Rev. Let.*, vol. 55, No. 20, Nov. 11, 1985, pp. 2200–2203.

"Variably Spaced Superlattice Energy Filter, a New Device Design Concept for High-Energy Electron Injection", by C. J. Summers and K. F. Brennan, *Appl. Phys. Lett.*, vol. 48, No. 12, Mar. 24, 1986, pp. 806–808.

"Resonant Tunneling Through a Double GaAs/AlAs Superlattice Barrier, Single Quantum Well Heterostructure", by M. A. Reed, J. W. Lee, and H-L. Tsai, *Appl. Phys. Lett.*, vol. 49, No. 3, Jul. 21, 1986, pp. 158–160.

"Electron Reflectance of Multiquantum Barrier (MQB)", by K. Iga, H. Uenohara, and F. Koyama, *Electronics Letters*, Sep. 11, 1986, pp. 1008–1010.

"Characterization of GaAs/AlGaAs Hot Electron Transistors Using Magnetic Field Effects on Launched-Electron Transport", by K. Imamura, S. Muto, N. Yokoyama, M. Sasa, H. Ohnishi, S. Hiyamizu and H. Nishi, *Surface Science*, vol. 174, 1986, North-Holland, Amsterdam, pp. 481–486.

"Theory of Resonant Tunneling in a Variably Spaced Multiquantum Well Structure: An Airy Function Approach", by K. F. Brennan and C. J. Summers, *J. Appl. Phys.*, vol. 61, No. 2, Jan. 15, 1987, pp. 614–623.

"Observation of Millimeter-Wave Oscillations from Resonant Tunneling Diodes and Some Theoretical Considerations of Ultimate Frequency Limits", by T. C. L. G. Sollner, E. R. Brown, W. D. Goodhue, and H. Q. Le, *Appl. Phys. Lett.*, vol. 50, No. 6, Feb. 1987, pp. 332–334.

"Electron Interference Effects in Quantum Wells: Observation of Bound and Resonant States", by M. Heiblum, M. V. Fischetti, W. P. Dumke, D. J. Frank, I. M. Anderson, C. M. Knoedler, and L. Osterling, *Phys. Rev. Let.*, vol. 58, No. 8, Feb. 23, 1987, pp. 816–819.

"The Variably Spaced Superlattice Energy Filter Quantum Well Avalanche Photodiode: A Solid-State Photomultiplier", by K. F. Brennan and C. J. Summers, *IEEE J. Quant. Elect.*, vol. QE-23, No. 3, Mar. 1987, pp. 320–327.

"The Variably Spaced Superlattice Electroluminescent Display: A New High Efficiency Electroluminescence Scheme", by K. F. Brennan and C. J. Summers, *J. Appl. Phys.*, vol. 61, No. 12, Jun. 15, 1987, pp. 5410–5418.

"A Pseudomorphic $In_{0.53}Ga_{0.47}As$/AlAs Resonant Tunneling Barrier with a Peak-to-Valley Current Ratio of 14 at Room Temperature", by T. Inata, S. Muto, Y. Nakata, S. Sasa, T. Fujii and S. Hiyamizu, *Jap. J. Appl. Phys.*, vol. 26, No. 8, Aug. 1987, pp. L1332–1334.

"Resonant Tunneling and Negative Differential Resistance in a Variably Spaced Superlattice Energy Filter", by C. J. Summers, K. F. Brennan, A. Torabi and H. M. Harris, *Appl. Phys. Lett.*, vol. 52, No. 2, Jan. 11, 1988, pp. 132–134.

"Room-Temperature Observation of Resonant Tunneling Through an AlGaAs/GaAs Quasiparabolic Quantum Well Grown by Molecular Beam Epitaxy", by S. Y. Chou and J. S. Harris, Jr., *Appl. Phys. Lett.*, vol. 52, No. 17, Apr. 25, 1988, pp. 1422–1424.

"Observation of Electron Quantum Interference Effects Due to Virtual States in a Double Barrier Heterostructure at Room Temperature", R. C. Potter and A. A. Lakhani, *Appl. Phys. Lett.*, vol. 52, No. 16, Apr. 18, 1988, pp. 1349–1351.

"Quantum Interference Effects in GaAs/GaAlAs Bulk Potential Barriers", by J. R. Hays, P. England, and J. P. Harbison, *Appl. Phys. Lett.*, vol. 52, No. 19, May 9, 1988, pp. 1578–1580.

"Theoretical Properties of Electron Wave Diffraction Due to a Transversally Periodic Structure in Semiconductors", by K. Furuya and K. Kurishima, *IEEE J. Quan. Elect.*, vol. 24, No. 8, Aug. 1988, pp. 1652–1658.

Chapter 1, vol. VIII, Quantum Phenomena, by S. Datta, Modular Series on Solid State Devices, Edited by R. F. Pierret and G. W. Neudeck, Addison-Wesley Publishing Company, 1989, pp. 5–37.

"High-Gain Pseudomorphic InGaAs Base Ballistic Hot-Electron Device", by K. Seo, M. Heiblum, C. M. Knoedler, J. E. Oh, J. Pamulapati, and P. Bhattacharya, *IEEE Elect. Dev. Let.*, Vo. 10, No. 2, Feb. 1989, pp. 73–75.

SOLID STATE QUANTUM MECHANICAL ELECTRON AND HOLE WAVE DEVICES

This invention was made with Government support under Contract No. DAAL03-897-1-K-0059 awarded by U.S. Army Research Office. The Government has certain rights in the invention.

BACKGROUND OF THE INVENTION

The present invention pertains to solid state quantum mechanical electron and hole wave devices and method for fabricating them and, in particular, to solid state quantum mechanical electron and hole wave devices such as, without limitation, low pass filters, high pass filters, narrow band and wide band notch filters, narrow band and wide band bandpass filters, impedance transformers, resonant electron and hole emitters, and so forth and method for fabricating them.

Recent progress in semiconductor growth technologies, particularly in molecular beam epitaxy (MBE) and metal organic chemical vapor deposition (MOCVD), enable those of ordinary skill in the art to grow multilayered superlattice structures with precise monolayer compositional control. For example, successively grown layers of narrow and wide band gap semiconductor materials such as GaAs and $Ga_{1-x}Al_xAs$ have been produced and widely used to provide multiple quantum well structures. In fact, there are many references in the prior art which are concerned with the use of these superlattice structures in resonant tunneling superlattice/multiple quantum well devices. Specifically, in such devices, a superlattice is formed by growing successive layers of narrow and wide band gap semiconductor material epitaxially and the materials and the widths of the layers in these devices are chosen so that quantum states which arise from spatial quantization effects in adjacent wells become coupled. Further, in such devices, the interaction of these coupled states leads to the formation of minibands of allowed energies through which carriers can tunnel.

Most of the above-described resonant tunneling superlattice devices disclosed in the prior art comprise a single quantum well, two barrier structure and such devices are of great interest as high frequency microwave oscillators. Recently, however, resonant tunneling through a multiple layer structure consisting of three wells and four barriers has been demonstrated in the GaAs/AlGaAs material system. Further, these structures have potential use as high energy injectors for electroluminescent devices, photodetectors, and fast ballistic transistors In addition to the above, there are prior art references which disclose the use of superlattices to provide miniband and forbidden energy bands at carrier energies above the barrier heights in order to produce negative differential resistance effects or to act as low-transmissivity blocking contacts.

In further addition to the above, there is presently great interest in the art in providing devices which exhibit high speed operation. Specifically, a major factor affecting the speed of semiconductor devices is the transit times of electrons from the input to the output terminals. If one can provide electrons which pass through the semiconductor without any scattering events, namely by "ballistic" or "collisionless" motion, then the transit time will be minimized and the potential speed of the devices will be maximized. The possibility of ballistic motion in semiconductor materials has recently been provided by experimental results in GaAs. As such, it is expected that when the length of the region to be traversed is on the same order as the electron mean free path (mfp), a sizable fraction of the electrons will traverse it ballistically. For example, although the mfp in silicon is on the order of 100 Angstroms (A), the mfp for electrons in GaAs is approximately 10 times greater.

In the interest of investigating the efficacy of fabricating such ballistic electron devices, experiments have been described in the prior art in which a GaAs layer is sandwiched between two layers of an alloy of AlGaAs. They report that AlGaAs is a suitable material for use therein because it has the same lattice constant as GaAs and, as a result, it can be grown epitaxially thereon. In addition, further reported experiments have shown that ballistic hole motion also occurs in GaAs, albeit at a lower fraction than that which occurs for electron motion due to the peculiar band structure of the valence band of GaAs.

As a consequence of the recent references available in the prior art, there exists a need for electron and/or hole filter devices, such as low pass, high pass, notch and bandpass filters which can be used to fabricate solid state devices requiring energy selectivity such as electroluminescent devices, photodetectors, ballistic transistors and so forth.

SUMMARY OF THE INVENTION

Embodiments of the present invention solve the aboveidentified need in the art by providing solid state quantum mechanical electron and hole wave devices which can provide, among other things, energy selectivity. In preferred embodiments of the present invention, energy selectivity is provided for substantially ballistiO electrOn wave propagation in superlattices at energies above the superlattice potential barriers. Further, in accordance with the inventive method set forth below, the inventive devices may be designed by transforming existing optical thin-film design methods and existing optical interference filter designs into inventive semiconductor devices.

Specifically, embodiments of the present invention comprise solid state: low pass filters; high pass filters; narrow band and wide band notch filters; narrow band and wide band bandpass filters; impedance transformers which are analogous to optical antireflection coatings; and high reflectance devices which are analogous to mirrors. Further specifically, these inventive solid state devices may be designed in accordance with the inventive method by transforming existing optical thin-film design methods and existing optical interference filter designs into inventive semiconductor devices. This transformation from existing optical design methods and existing optical interference filter designs into semiconductor devices is performed for electron devices by mapping the optical phase index of refraction into a first solid state index of refraction for phase quantities which is proportional to the square root of the product of the electron kinetic energy and the electron effective mass and by mapping the optical amplitude index of refraction into a second solid state index of refraction for amplitude quantities which is proportional to the square root of the electron kinetic energy kinetic energy divided by the electron effective mass. That is, the mapping which makes an exact analogy between the quantum mechanical electron wave and the electromagnetic optical wave comprises using the following electron wavevector:

$$= [2m^*(E-V)]^{\frac{1}{2}}$$

for the optical wavevector and using teh following electron wave amplitude refractive index:

$$n_3(amplitude) = [(E-V)/mI]^{\frac{1}{2}}$$

in expressions for reflectivity and transmissivity at a boundary, which expressions are well known to those of ordinary skill in the art from electromagnetic design.

As a result, the use of these mappings between optical quantities and solid state quantities, enables one to use well known optical designs to provide analogous solid state filter devices which have Butterworth, Chebyshev, elliptic function, or other well known filter characteristics. In addition, the inventive solid state filter devices can be incorporated monolithically into transistor structures in order to increase their speed.

As will be described in further detail below in the Detailed Description, the efficacy of the mapping between the electromagnetic optical waves and quantum mechanical electron waves depends on the utilization of ballistio electron transport in the solid state materials, i e., the condition where electrons travel through the solid state materials without being scattered by deviations from crystalline perfection. The ballistic electrons have energies above the potential barriers in the solid state materials and exhibit quantum mechanical plane wave behavior. Further, since these plane waves maintain their phase through the device, these coherent waves will refract, reflect, interfere, and diffract in a manner which is analogous to the behavior of electromagnetic waves traveling through dielectrics.

Doping of semiconductors is not important for the embodiments of the present invention, however, it preferred to exclude doping in order to avoid scattering within the materials. This provides a further advantage for the inventive devices because the absence of doping makes them easier to fabricate.

Present developments in the field of providing solid state materials, such as, for example, materials grown by MBE and/or by MOCVD have produced improved products which provide for substantially ballistic electron transport. Thus, the use of multilayer superlattices comprised of materials which substantially support ballistic electron transport are used to form embodiments of the present invention in which electrons are injected into superlattice structures at energies above the corresponding potential energy barriers to provide electron interference effects which are exactly analogous to those which occur in electromagnetic wave propagation in dielectric films. As a result, the quantitative mapping between quantum mechanical electron wav propagation in semiconductors and electromagnetic optical wave propagation in dielectrics can be used to translate thin-film optical device designs into semiconductor superlattice designs.

Although we have discovered that electron wave propagation at energies above the potential barriers can be mathematically described by a mapping between quantum mechanical electron waves in semiconductors and electromagnetic optical waves in dielectrics, semiconductor superlattice interference filt er designs, for example, cannot merely be copies of thin-film optical filter designs. This is because, although optical designs which may be realized in nature are constrained by the available material indices of refraction, the design of the analogous semiconductor devices such as superlattice interference filters will be constrained by the fact that the thicknesses of layers in the superlattices are restricted to be integer multiples of monolayer thicknesses and by the fact that the requirement of substantially collisionless transport for the carriers limits the usable composition ranges of the materials. This occurs because the requirement of collisionless transport often precludes using material compositions which have indirect band gaps. Nevertheless, as should be clear to those of ordinary skill in the art, one may use a trial and error method of determining which designs are physically realizable. However, in a preferred embodiment of the inventive method which is described in detail below in the Detailed Description comprises a systematic method for determining superlattice designs which meet the appropriate physical constraints.

First embodiments of the inventive solid state electron wave devices comprise solid state analogs of Fabry-Perot optical interference filters which are fabricated from alloys of AlGaAs and GaAs.

BRIEF DESCRIPTION OF THE DRAWING

A complete understanding of the present invention may be gained by considering the following detailed description in conjunction with the accompanying drawing, in which.

To facilitate understanding, identical reference numerals are used to designate elements common to the figures.

DETAILED DESCRIPTION

Figure 1:
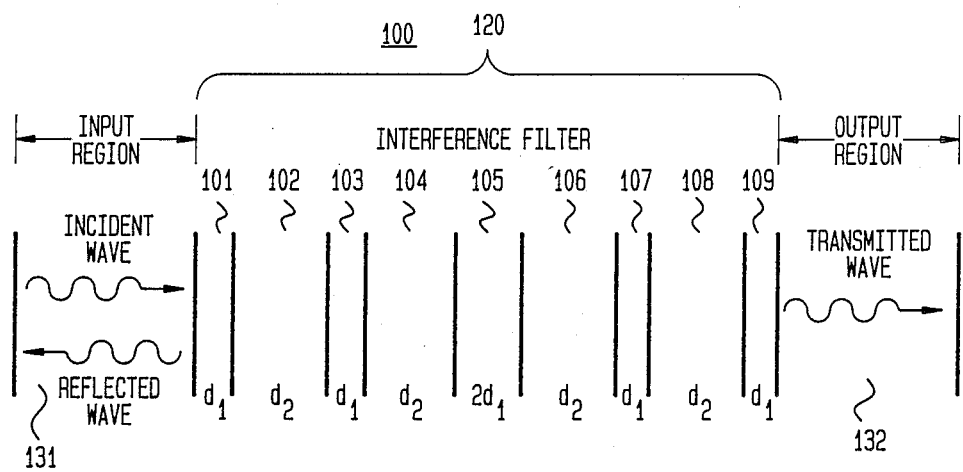
FIG. 1 shows, in pictorial form, an electron superlattice interference filter fabricated in accordance with the present invention.

FIG. 1 shows, in pictorial form, an electron wave superlattice interference filter 100 fabricated in accordance with the present invention. Inventive filter 100 provides a narrow bandpass transmission filter for specific incident electron kinetic energies which are greater than the heights of the potential barriers of the materials which comprise layers 101–109 of superlattice 100 and input layer 131 and output layer 132. As will be described in detail below, the thicknesses of layers 101–109, the compositions of the materials comprising layers 101–109 and the heights of the potential barriers of layers 101–109 are determined in accordance with the inventive method by utilizing a mapping between quantum mechanical electron waves in semiconductors and electromagnetic optical waves in dielectrics. The inventive method advantageously uses this mapping to apply existing thin film optical design techniques and existing optical designs to design corresponding solid state quantum mechanical electron wave devices.

Figure 2:
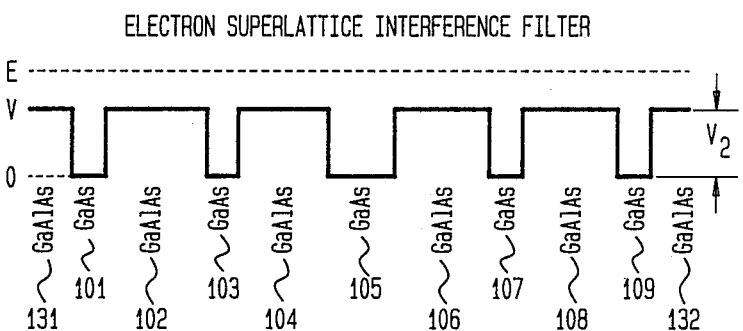
FIG. 2 shows, in pictorial form, the energy level diagram and the material composition of the electron superlattice interference filter of FIG. 1.

FIG. 2 shows, in pictorial form, the energy level diagram and the material composition of the electron superlattice interference filter of FIG. 1. As shown in FIG. 2, input and output layers 131 and 132, respectively, are comprised of $Ga_{0.55}Al_{0.45}As$. Superlattice 120 is comprised of quarter-wavelength layer 101 of GaAs, quarter-wavelength layer 102 of $Ga_{0.55}Al_{0.45}As$, quarter-wavelength layer 103 of GaAs, quarter-wavelength layer 104 of $Ga_{0.55}Al_{0.45}As$, half-wavelength layer 105 of GaAs, quarter-wavelength layer 106 of $Ga_{0.55}Al_{0.45}As$, quarter wavelength layer 107 of GaAs, quarter-wavelength layer 108 of $Ga_{0.55}Al_{0.45}As$, and quarter-wavelength layer 109 of GaAs, where the term quarter-wavelength and half-wavelength will be defined below. Further, as shown in FIG. 1, the thicknesses of layers 101, 103, 107, and 109 are each six (6) monolayers of GaAs, i.e., 16.9599 A, and the thicknesses of layers 102, 104, 106 and 108 are each nine (9) monolayers of $Ga_{0.55}Al_{0.45}As$, i.e., 25.4398 A, where we have taken a monolayer of both GaAs and $Ga_{0.55}Al_{0.45}As$ to be 2.82665 A. Still further, as shown in FIG. 1, the thickness of layer 105 is twice that of layer 101.

Figure 4:
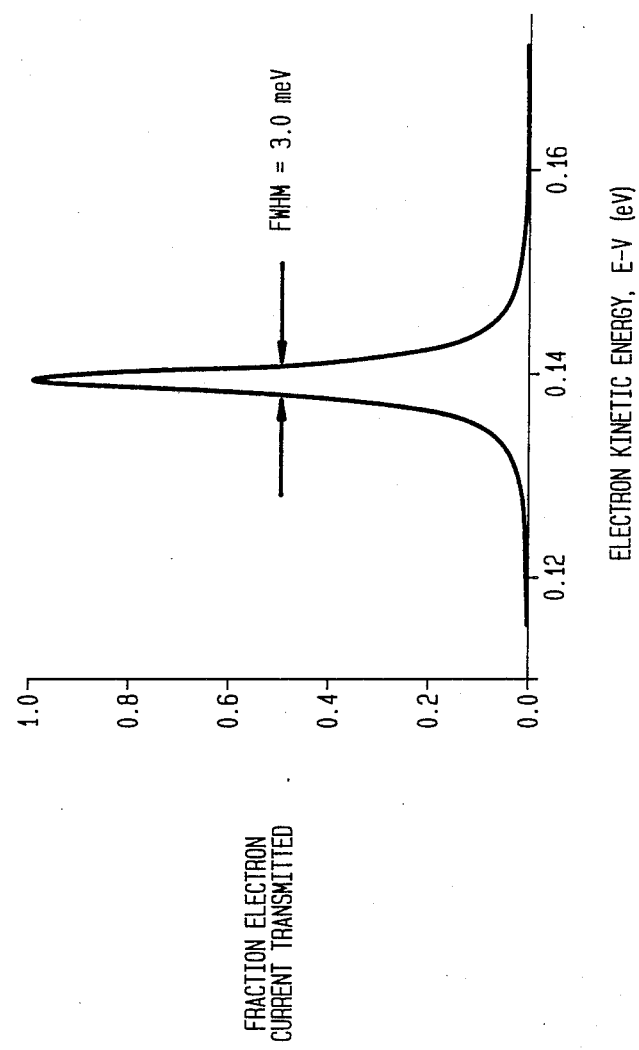
FIG. 4 shows, in pictorial form, the transmissivity of the electron superlattice interference filter of FIG. 1.

FIG. 4 shows, in pictorial form, the transmissivity of electron superlattice interference filter 100 of FIG. 1. The pass electron kinetic energy, determined in the manner explained below by reference to the kinetic energy of an electron in input $Ga_{0.55}Al_{0.45}As$ layer 131, is 0.139 eV and the passband has a full width at half maximum (FWHM) of 0.003 eV, which passband is only 2.2% of the pass electron kinetic energy. Further, it is important to note that the inventive filter advantageously provides a transmission at maximum which is substantially equal to 100%.

We will now describe the inventive method which provides a quantitative mapping between quantum mechanical electron waves in semiconductor materials and electromagnetic optical waves in dielectrics. The mapping is then used, in the manner that is explained below, to translate existing optical design methods and existing optical designs into methods and designs for analogous solid state devices. In accordance with the inventive method, the mapping comprises: (1) mapping optical phase effects by using an "electron wave phase refractive index" that is proportional to the square root of the product of the electron effective mass and the electron kinetic energy and (2) mapping optical amplitude effects by using an "electron wave amplitude refractive index" that is proportional to the square root of the ratio of the kinetic energy to the effective mass.

It is important to note that the above-described mapping applies to the case of electron waves in semiconductor materials, which case depends, in turn, on the fact that: (1) the electrons have energies above the potential barriers in the semiconductor materials —note electron energy E in FIG. 2—and (2) the electrons exhibit ballistic or collisionless motion in the semiconductor materials. It is also important to further note that the extent to which the practical embodiments of the inventive devices conform with the designs described herein depends on the amount of ballistic motion which occurs in the materials out of which they are fabricated. This means that the behavior of the inventive devices will more closely resemble the desired and designed characteristics if the electron transport within the materials is substantially ballistic. However, it is also important to note that the inventive devices will also perform in accordance with the designed characteristics, albeit in a degraded fashion, if the electron transport is not substantially ballistic, i.e., their performance will "gracefully" degrade. However, present fabrication techniques in molecular beam epitaxy (MBE) and metal organic chemical vapor deposition (MOCVD), enable those of ordinary skill in the art to grow multilayered superlattice structures with precise monolayer compositional control and with materials which provide substantially ballistic electron transport. In addition, doping of semiconductors is not important for the embodiments of the present invention however it preferred to exclude doping in order to avoid scattering within the materials. This provides a further advantage for the inventive devices because the absence of doping makes them easier to fabricate.

As set forth above, the inventive method depends on a mapping between quantum mechanical electron waves and optical electromagnetic waves. Further, it is important to note that the mapping provides an exact parallel between quantities for quantum mechanical electron waves and electromagnetic optical waves. This mapping was determined, as explained in Appendix I, by examining the behavior of electron waves at a potential energy barrier and comparing it with the behavior of electromagnetic waves at the boundary between two dielectrics. The mapping differs for phase effects, which depend on path differences, and for amplitude effects. For phase effects, the electron wave phase refractive index $n_e$(phase) is proportional to the square root of the product of the effective mass and the kinetic energy, i.e., $n_e$(phase) is proportional to $[m^*(E-V)]^{\frac{1}{2}}$.

For amplitude effects such as transmissivity and reflectivity, the electron wave amplitude refractive index $n_e$(amplitude) is proportional to the square root of the ratio of the kinetic energy to the effective mass., i.e., $n_e$(amplitude) is proportional to $[(E-V)/m^*]^{\frac{1}{2}}$.

Note the following important factors concerning the mapping of the inventive method: (1) even though electromagnetic optical waves involve polarization and the mapping for amplitude effects is a single parameter which has dimensionality, there appears to be no inconsistency because, as shown in Appendix II, only dimensionless ratios of the electron wave amplitude refractive indices appear in the transmissivity and reflectivity expressions for electron waves; (2) both the phase effect and amplitude effect electron wave refractive indices exhibit "normal" dispersion, i.e., they increase with decreasing wavelength or increasing energy; and (3) although semiconductor materials (a) may have nonparabolic bandstructure in terms of E vs. k, i.e., energy vs. momentum, and (b) may have band structures which vary with a particular direction of electron wave propagation in the material, these effects may be incorporated into the inventive method by using an energy dependent, anisotropic effective mass $m^*$. Thus, even though the allowed wavevector surface is no longer spherical in the presence of anisotropy, all of the inventive design methods set forth herein still apply, provided the energy dependent anisotropic effective mass is used in the analysis.

In summary, quantum mechanical electron waves in semiconductors and electromagnetic optical waves in dielectrics exhibit transmission, reflection, interference, and diffraction characteristics that are analogous to each other. As described above and as shown in Appendix I, we have analyzed quantum interference effects for the general case of any number of boundaries and any angle of incidence and from these results we have discovered a mapping between electromagnetic and quantum mechanical quantities. As a result existing optical device designs now have electron and hole wave device counterparts. This mapping was derived, as shown in Appendix I, by recognizing that continuity of the quantum wave function across a potential energy boundary is analogous to the continuity of the tangential component of the electric field across a boundary between dielectrics. Similarly, conservation of electron probability current normal to a potential energy boundary is analogous to conservation of power flow normal to a boundary between dielectrics. Lastly, we may restate the mapping of the inventive method as follows for using existing optical design methods and existing optical designs: (1) use the following electron wavevector $k=[2m^*(E-V)]^{\frac{1}{2}}$ in place of the optical wavevector and (2) use the following electron wave amplitude refractive index $[(E-V)/m^*]^{1/8}$ in place of the optical index of refraction in expressions for reflectivity and transmissivity at a boundary.

In light of our discovery, we have determined that the inventive superlattice electron wave devices such as interference filters share common characteristics with thin-film optical interference filters. As a result, it is useful to review some of the primary properties of these optical filters and, in so doing, we will, at the same time, be reviewing characteristics of inventive superlattice electron interference filters.

A simple type of narrow bandpass optical interference filter is a Fabry-Perot filter. It is comprised of a half-wavelength layer, frequently referred to as a "spacer" in the optical literature, which is sandwiched between reflectors. In the case of an all-dielectric Fabry-Perot filter, the reflectors are stacks of high index, designated H, and low index, designated L, quarter-wavelength layers. The FWHM of the bandpass of this type of filter can be reduced by increasing the reflectivity at the boundaries between the layers. This may be accomplished by increasing the ratio of the high index of refraction, $n_H$, to the low index of refraction, $n_L$. Furthermore, for a given number of layers, the higher reflectances occur with the high index, H, layers on the outside boundaries of the filter. The half-wavelength, resonant layer at the center of the filter may be of high index of refraction, $n_H$, or low index of refraction, $n_L$, material. Thus, there are two basic types of all-dielectric Fabry-Perot interference filters. In the optical literature, these are symbolically represented as $[HL]^N HH[LH]^N$ and $H[LH]^N LL[HL]^N H$ where H and L represent quarter-wavelength layers of high and low index of refraction materials, respectively, and N represents the number of repetitions of the layer-pair type indicated in square brackets.

Other important characteristics of all-dielectric interference filters which are well known to those of ordinary skill in the art, which characteristics, in accordance with the inventive method also apply to the analogous. inventive solid state electron wave filters, are: (1) the maximum transmittance of the filter is 100%; (2) the maximum transmittance occurs at the wavelength for which (a) the spacer layer is a halfwavelength thick, as measured in that material, and (b) the reflected layers are a quarter-wavelength thick, as measured in those materials, which wavelength will be referred to below as the pass wavelength; (3) the FWHM decreases as the number of quarter-wavelength layers is increased; (4) the transmittance characteristic is symmetric about the pass wavelength when the transmittance characteristic is plotted as a function of the reciprocal of the wavelength as measured in the material surrounding the filter; (5) a proportional change in the thicknesses of all layers produces a simple displacement of the transmittance characteristic plotted as a function of the reciprocal wavelength; (6) if the thicknesses of all layers are increased by an odd integer factor, a passband will occur at the original pass wavelength and it will have a decreased FWHM; (7) as the angle of incidence upon the filter is increased, the pass wavelength is tuned to shorter wavelengths; (8) the transmittance characteristic is relatively insensitive to variations in the reflectivities and thicknesses of the layers; (9) normal dispersion causes a narrowing of the FWHM; and (10) the filter is effective over only a limited range since sidebands necessarily occur on either side of the passband.

Specific nomenclature well known to those of ordinary skill in the art when referring to such filters is given as follows: (1) the range from the nearest passband peak below the pass wavelength to the nearest passband peak above the pass wavelength is called the free spectral range, FSR; (2) the finesse is equal to FSR/FWHM; and (3) the resolving power is equal to pass wavelength/one-half FWHM.

Using the above-described mapping we can determine the characteristics of a many-boundary semiconductor superlattice system. This is done, as shown in Appendix II, by applying the chain-matrix approach commonly used in electromagnetics and by substituting the electron wavevector given by the inventiv mapping for phase quantities for the optical wave vector and by substituting the electron wave amplitude refractive index given by the inventive mapping for indices of refraction in the expressions for the reflectivity and transmissivity at a boundary.

The following example shows how to translate an optical design into a solid state design. In this example, an optical thin film design that appears in a book by A. Thelen entitled "Physics of Thin Films," vol. 5, edited by G. Hass and R. E. Thun, *Academic Press, New York*, eds., 1969, in the chapter which starts at p. 47 is translated into a design for an electron wave filter. The optical design is an eleven-layer structure which exhibits a FWHM bandpass of 2.2% of the design pass wavelength. In the notation of optical thin film design, the optical filter is designated 1.0 HL HH LHLHL HH L'H 1.0; where 1.0 indicates air for the input and output regions, H indicates a quarter-wavelength thickness layer of high index (as measured in the medium), and L indicates a quarter-wavelength thickness layer of low index (as measured in the medium). Thus, the notation HH signifies a half-Wavelength thickness layer of high index. For the optical design, $n_H = 4.0$, $n_L = 1.35$, and $n_{L'} = 1.83$. For a pass wavelength of 1.00 um, the physical thicknesses of the layers for the optical filter are given as follows in Table I.

TABLE I

Design Parameters for a Narrow-Band Optical Interference Filter of the 1.0 HL HH LHLHL HH L'H 1.0 Type
Optical Thin Film Filter
(Pass Wavelength = 1.00 um)

| | Refractive Index | Thickness (A) |
|---|---|---|
| Input Region | 1.00 | ... |
| Region 1 (H) | 4.00 | 625.000 |
| Region 2 (L) | 1.35 | 1851.852 |
| Region 3 (L') | 1.83 | 1366.120 |
| Output Region | 1.00 | ... |

The corresponding electron wave superlattice filter design is obtained in accordance with the inventive mapping set forth above in the following manner. First, calculate the electron pass kinetic energy $(E-V_0)$ in the input region, $m=0$, associated with the desired electron wave pass wavelength $lam_{e,0}$ in the input region from the following equation:

$$(E-V_0) = h^2/2m_0^* lam_{e,0}^2 \quad (1)$$

where $m_0^*$ is the electron effective mass for the input or $m=0$ region. Second, calculate a scaling factor D to convert the quantity $[(E-V_m)/m_m^*]^{\frac{1}{2}}$ for layer m into $n_{e,m}$ (amplitude) for the same layer from the following equation:

$$= n_0/[(E-V_0)/m_0^*]^{\frac{1}{2}} \quad (2)$$

where $n_0$ is the refractive index of the input, $m=0$, region of the optical design. Third, calculate for each m-th layer, the required value of $(E-V_m)$ from the following equation:

$$(E-V_m) = (n_m/D)^2 m_m^* \quad (3)$$

where $n_m$ is the refractive index in the optical design for the m-th region and $m_m^*$ is the electron effective mass for the m-th region. Fourth, calculate the thickness of the quarter-wavelength layers using the electron wave phase refractive index which gives the physical thickness of the m-th layer as:

$$d_m h/\{2^{5/2}[m_m^*(E-V_m)]^{\frac{1}{2}}\} \quad (4)$$

Then, by following this procedure, the optical thin film interference filter design is converted to an electron wave interference filter design. Selecting a pass wavelength of 100 A for the solid state filter, the resulting kinetic energies (E−V) and thickness values are given in Table II, where for simplicity the electron effective masses are taken to be the free electron mass in all layers in this example.

TABLE II

Design Parameters for a Narrow-Band Electron Superlattice Interference Filter Which Corresponds to an Optical Interference Filter of the 1.0 HL HH LHLHL HH L'H 1.0 Type Electron Superlattice Filter (Pass Wavelength = 100 A)

| | Kinetic Energy (eV) | Thickness (A) |
|---|---|---|
| Input Region | 0.015037 | ... |
| Region 1 (H) | 0.240592 | 6.25000 |
| Region 2 (L) | 0.027405 | 18.51852 |
| Region 3 (L') | 0.050357 | 13.66120 |
| Output Region | 0.015037 | ... |

If the calculated thicknesses are too small for reasonable practical fabrication of a semiconductor superlattice or the thicknesses are less than monolayer thicknesses, the thicknesses of all layers can be increased by an odd integer factor. Just as was described above for the case of an optical interference filter, this will cause the FWHM of the solid state filter to be decreased by the same factor and, as a result, the solid state filter will become a narrower band filter. For example, for the above described interference filter design, increasing the solid state layer thicknesses by a factor of 3 or 5 reduces the FWHM from 2.2% of the passband wavelength to 0.73% or 0.44% of the pass wavelength, respectively. However, the finesse of the filter, i.e., the ratio of the rejected bandwidth to the pass bandwidth, is also decreased when these larger thicknesses are selected. Further, it is also important to note that just like optical thin film interference filters, the inventive electron superlattice interference filter can also be continuously tuned to lower pass wavelengths and, hence, higher energies, merely by mechanically rotating the filter so as to increase the angle of incidence away from normal incidence.

Figure 3:
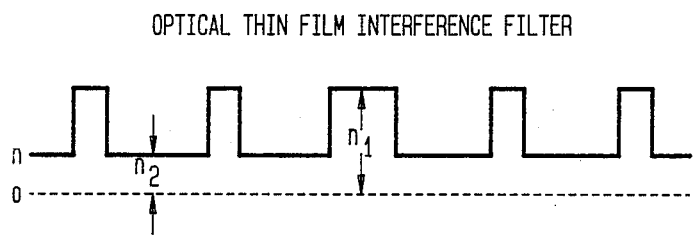
FIG. 3 shows, in pictorial form the index refraction diagram of an optical thin film interference filter which is the optical analog of the electron superlattice interference filter of FIG. 1.

The above described method was applied to design the inventive filter 100 shown in FIG. 1. Specifically, FIG. 3, shows the analogous optical interference wave filter design that corresponds to solid state filter 100 in FIG. 1. As previously discussed, filter 100 comprises superlattice 100 formed from layers of GaAs and $Ga_{0.5}Al_{0.45}As$, which superlattice 100 is surrounded by input and output $Ga_{0.55}Al_{0.45}As$ layers 131 and 132. The effective masses used in the design of filter 100 were taken from prior art literature to be $m^*(GaAs)=0.067m_0$ and $m^*(Ga_{0.55}Al_{0.45}As)=010435m_0$, where $m_0$ is the free electron mass. The conduction band edge energies used were $V(GaAs)=0.0000$ eV and $V(Ga_{0.55}Al_{0.45}As)=0.3479$ eV and a monolayer thickness of both GaAs and $Ga_{0.55}Al_{0.45}As$ was taken to be 2.82665 A. As a result, for these materials, 6 monolayers of GaAs $(d_1=16.9599$ A) and 9 monolayers of $Ga_{0.55}Al_{0.45}As$ $(d_2=25.4398$ A) both closely correspond to quarter-wavelength layers at an electron wavelength of 101.652 A or an electron kinetic energy of 0.139456 eV as measured in the surrounding $Ga_{0.55}Al_{0.45}As$.

The above described inventive structures can be fabricated using techniques well known to those of ordinary skill in the art such as, for example, molecular beam epitaxy. Further, in accordance with the present invention, one can change the pass kinetic energy with a judicious selection of the composition of the materials, such as, for example, the ratio of Ga to Al in the above described example. Thus, to obtain a specified pass kinetic energy, the design procedure is as follows: (1) for a material system of the $F_{1-x}G_xH$ type, find values of x such that an integer number of monolayers of the material is equal to a quarter wavelength at the pass kinetic energy (E−V) as measured in the material; (2) select values of x which are separated as much as possible in order to maximize the reflectivity at each boundary (For example, in the abovedescribed example, this is accomplished by choosing x=0 and 0.45); and (3) a basic bandpass filter may then be constructed, as in optics, by sandwiching a half-wavelength layer between quarter-wavelength layers of alternating material types (The FWH and the finesse are controlled by the number of surrounding quarter-wavelength layers, i.e., the FWHM is decreased and the finesse is increased as further quarter-wavelength sections are added). It should be clear to those of ordinary skill in the art that the inventive superlattice devices may be comprised of layers which have a multiplicity of differing material compositions in addition to the type of device shown, for example, in FIG. 1, comprises a superlattice formed from layers of only two different materials. The designs having layers of more than two different materials may result from the need to fabricate a solid state analog of a particular type of optical thin-film device.

In designing solid state devices in accordance with the present invention, one can choose an appropriate material composition which will provide the quarter-wavelength and half-wavelength layers required by a particular filter design by trial and error. However, we will now describe a preferred embodiment of the inventive method which provides a systematic method for choosing such compositions in a particular case. Consider a material system which forms a continuous set of alloys of the type $F_{1-x}G_xH$. The range of usable compositions is given by the range in x from 0 to $x_{max}$, for example. This occurs because there may be a possible transition at $x_{max}$ from a direct energy bandgap material to an indirect energy bandgap material such as occurs in the case of $Ga_{1-x}Al_xAs$. Although there is no prohibition in principal against the use of indirect bandgap materials, they cannot be used where the transition between a direct and an indirect bandgap material or between two indirect bandgap materials requires a change in momentum. This is because we are dealing with wave effects that occur in substantially collisionless motion.

In considering the systematic method for choosing material compositions, assume the solid state electron wave filter is comprised of three types of materials: (1) the materials which surround the superlattice, i=0 regions, have compositions $x_0$; (2) the material in the high refractive index regions of the two-material superlattice, i=1 regions, have compositions $x_1$; and (3) the material in the low refractive index regions of the two-material superlattice, i=2 regions, have compositions $x_2$. The monolayer thicknesses are $r_1$ and $r_2$ for the i=1 and i=2 regions, respectively. The electron potential energy in the three regions, as is well known in the art, is given by:

$$V_i = delE_c = Ax_i, i=0,1,2 \quad (5)$$

where $delE_c$ is the change in the energy of the conduction band edge and A is a constant. Further, it is also well known in the art that the electron effective mass in the three types of regions is given by:

$$m = (B + Cx_i)m_0 = 0,1,2 \quad (6)$$

where B and C are constants and $m_0$ is the free electron mass. The electron kinetic energy in the i-th region is $(E - V_i) = h^2/2m_i(1am_i)^2$. The total electron energy to be passed by the filter is designated $E_p$. The pass kinetic energy as measured in the various regions is thus:

$$E_p - V_i = h^2/2_i^*(1am_p)^2_i = 0,1,2. \quad (7)$$

where $(1am_p)_i$ is the pass wavelength as measured in the i-th region. The overall pass kinetic energy of the filter as measured in the material surrounding the superlattice is $E_p - V_0$. This is the pass kinetic energy that is specified by the user and is thus the starting point in the design procedure. Using the above equations and solving for pass wavelength gives:

$$(1am_p)_i = h/\{2m_0[-ACx_i^2 + (CE_p - AB)x_i + BE_p]\}^{1/2} i=0,1,2 \quad (8)$$

The thicknesses of the superlattice layers are designated $d_i$ for i=1,2. These thicknesses must be integer multiples of the monolayer thicknesses $r_i$. Further, these thicknesses must also be odd multiples of a quarter wavelength as measured in these regions. These constraints may be expressed as:

$$d_i = p_i r_i = (2q_i - 1)(1am)_i/4 \ i=1,2 \quad (9)$$

where $p_i$ is the integer number of monolayers for the i-th region and $q_i$ is a positive integer 1,2,3,... Using the above two equations gives the following quadratic equation for composition $x_i$:

$$ACx_i^2 + (AB - CE_p)x_i + (h^2/32m_0)[(2q_i-1)^2/p_i^2r_i^2] - BE_p = 0 \quad (10)$$

This equation can be solved by the well known formula for quadratic equations. In order to design a superlattice interference filter, at least two solutions for $x_i$ must be found in the range from 0 to $x_{max}$. The smallest value of $x_i$ within this range will become $x_1$, the composition of the high index material. The value of $p_i$ that produces 1 becomes $p_1$, the number of monolayers of type 1 material used to make a quarter-wavelength layer. Similarly, the largest value of $x_i$ within this range will become $x_2$, the composition of the low index material. The value of $p_i$ that produces $x_2$ becomes $p_2$, the number of monolayers of type 2 material used to make a quarter-wavelength layer.

To allow the broadest range of solutions, $V_0$ is set to $V_{max}$. For a specified pass kinetic energy $(E - V_0)$, the value of $E_p$ is then determined. Further, to minimize the total thickness of the filter, $q_i$ is initially set equal to unity. Then the quadratic equation is repetitively evaluated for $p_i = 1,2,3,\ldots$ until all of the positive real roots in the range from 0 to $x_{max}$ are found. If only one root or no roots are found, then the procedure must be started over with changed parameters. The quantities that can be varied are the integer $q_i$, the surrounding material composition $x_0$ which changes $E_p$, and the crystallographic direction of growth which changes $r_i$.

After $x_l$, $p_1$, $x_2$, and $p_2$ have been determined as described above, the other parameters of the filter can be calculated. The potential energies $V_i$, the effective masses $m_i^*$, the electron wavevector magnitude $k_i$, and the electron wave amplitude refractive index $n_e(amplitude)_i$ can be computed in accordance with the above-described equations for each type of region.

As an example, consider the following example for the $Ga_{1-x}Al_xAs$ material system. This is an advantageous material system because all compositions are lattice matched for these alloys. For growth along the [100] direction, the monolayer thickness is $r = r_1 = r_2 = 2.282665$ A. The material is a direct gap semiconductor for x less than or equal to 0.45 and, as a result, this represents the usable composition range. Further, for $Ga_{1-x}Al_xAs$, A=0.77314eV, B=0.067 and C=0.083.

As an example, to design a $Ga_{1-x}Al_xAs$ superlattice interference filter with a pass kinetic energy of 0.20 eV such as might be useful for an emitter in a high speed ballistic transistor, the following calculations are performed. Let $x_{0=xmax}=0.45$. Thus $V_0=0.347913$ and, since $E_p - V_0 = 0.20$eV, then $E_p = 0.547913$ eV. Letting $q_i=1$, the composition $x_i$ is evaluated for $p_i=1,2,3,\ldots$ until all of the positive real roots are found in the range of 0 to 0.45. For the present case there are two roots, i.e., $x_2=0.3984$ corresponding to $p_2=6$ and $x_l=0.2063$ corresponding to $p_i=7$. The smaller value of $x_i$ is designated $x_1$ and the larger value $x_2$. The thickness of the $Ga_{0.79}Al_{0.21}As$ quarter-wavelength layer is $d_1 = p_1r = 19.7866$ A, seven (7) monolayers. The thickness of the $Ga_{0.60}Al_{0.40}As$ quarter-wavelength layer is $d_2 = p_2r = 16.9599$ A, six (6) monolayers. The electron effective masses in the three regions are calculated to be $m_0 = 0.10435m_0$, $m_1 = 0.084126m_{00}$, and $m_2^* = 0.10007m_0$. The pass kinetic energies in the three regions are $E_p - V_0 = 0.2000$ eV, $E_p - V_1 = 0.3884$ eV, and $E_p - V_2 = 0.2399$ eV. The electron wave amplitude refractive indices normalized to the surrounding i=0 regions are $n_e$(amplitude)$_0$=1.000000, $n_e$(amplitude)$_1$ =1.552027, and $n_e$(amplitude)$_2$ =1.118372. For a 13-layer Fabry-Perot interference filter of the form $[HL]^3HH[LH]^3$, these calculated material characteristics produce a filter having a pass band of 0.20 eV and a FWHM of 15.4 meV.

Repeating the above-described procedure, $Ga_{1-x}Al_xAs$ superlattice filters were designed for pass kinetic energies for 0.14 eV up through 0.20 eV, the range of energies potentially most useful in ballistic transistors. The positive real roots are shown in Table III for 6 through 10 monolayer thicknesses. Roots must be in the range from 0 to 0.45. At the 0.14 eV low end of this energy range, there are essentially four roots. At the 0.20 eV high end of the energy range, there are two roots.

Note that, like their thin-film optical counterparts, semiconductor superlattice interference filters will be relatively insensitive to variations about the design composition values. Further, the effects of nonparabolic and anisotropic energy band structure, if present, may be incorporated into the design process by using an energy dependent effective mass. Still further, there is considerable flexibility in the design of semiconductor superlattice interference filters. For example, other odd multiples of a quarter wavelength may be used $q_i=2,3,4,\ldots$, the surrounding material can be changed to alter $V_0$, and other crystallographic growth directions may be used to alter $r_1$.

TABLE III

Calculated compositions, values of x in $Ga_{1-x}Al_xAs$, that produce one quarter-wavelength layers for the kinetic energies and number of monolayers indicated. In all cases, the surrounding material is $Ga_{0.55}Al_{0.45}As$ and the monolayers are crystalline (100) planes and only compositions where x is less than or equal to 0.45 are used.

| Pass Kinetic Energy (eV) | Number of Monolayers | | | | |
|---|---|---|---|---|---|
| | 6 | 7 | 8 | 9 | 10 |
| 0.140 | 0.0015 | 0.2902 | 0.3923 | 0.4513 | 0.4898 |
| 0.145 | 0.0278 | 0.2996 | 0.4004 | 0.4588 | 0.4970 |
| 0.150 | 0.0502 | 0.3088 | 0.4084 | 0.4663 | 0.5042 |
| 0.155 | 0.0702 | 0.3180 | 0.4164 | 0.4738 | 0.5115 |
| 0.160 | 0.0885 | 0.3272 | 0.4244 | 0.4813 | 0.5187 |
| 0.165 | 0.1057 | 0.3363 | 0.4324 | 0.4888 | 0.5259 |
| 0.170 | 0.1219 | 0.3453 | 0.4403 | 0.4963 | 0.5331 |
| 0.175 | 0.1373 | 0.3543 | 0.4482 | 0.5037 | 0.5403 |
| 0.180 | 0.1520 | 0.3632 | 0.4561 | 0.5112 | 0.5475 |
| 0.185 | 0.1662 | 0.3721 | 0.4640 | 0.5186 | 0.5547 |
| 0.190 | 0.1800 | 0.3809 | 0.4718 | 0.5260 | 0.5619 |
| 0.195 | 0.1933 | 0.3897 | 0.4797 | 0.5334 | 0.5690 |
| 0.200 | 0.2063 | 0.3984 | 0.4875 | 0.5408 | 0.5762 |

Clearly, those skilled in teh art recognize that further embodiments of the present invention may be made without departing from its teachings. For example, it is within the spirit of the present invention to provide a wide variety of hole wave devices as well as electron wave devices. In addition, it is within the spirit of the present invention that a wide variety of electron or hole wave devices which use electron or hole wave propagation above the potential barrier can be fabricated which are analogous to electromagnetic optical wave devices. Further, in accordance with the inventive method, such devices can be fabricated using the existing methods for determining optical designs and using the inventive mapping described above. Specifically, such devices include low pass filters, high pass filters, notch filters (narrow band and wide band), bandpass filters (narrow band and wide band), impedance transformers (antireflection devices), and high reflectance surfaces (mirrors). In addition, the filters can have Butterworth (maximally flat), Chebyshev, elliptic function, or other types of characteristics which are well known in the art. Further in addition, such inventive devices may be used to provide monoenergetic electron sources for an entire class of devices such as electroluminescent devices, photodetectors, and ballistic transistors. Still further in addition, such inventive devices may be used to aid in contolling, shaping and filtering freespace electron beams to provide electron spectrometers, electron lithography and electron diffraction analysis of crystals.

In addition to the above, in accordance with the present invention, one can guide electrons or holes by, for example, injecting them into a semiconductor layer which is sandwiched between superlattices which have been designed, in accordance with the techniques described above, to provide total reflection.

In terms of nomenclature, it should be clear to those of ordinary skill in the art that references to electron energies being above the potential barriers, correspond to energies, as shown in FIG. 2, which are above the conduction band. Further, it should also be clear to those of ordinary skill in the art that similar references for holes correspond to energies which are below the valence band.

Lastly, it should be clear to those of ordinary skill in the art that appropriate solid state materials for use in fabricating embodiments of the present invention include semiconductor materials such as, without limitation, binary, ternary and quaternary compositions of, among others, III-V elements and II-VI elements.

APPENDIX I

The following illustrates the manner in which the mapping between quantum mechanical electron waves and electromagnetic optical waves is determined by comparing equations which describe quantum mechanical electron wave transmission and reflection at a potential energy step with electromagnetic optical wave transmission and reflection at a boundary between two dielectrics.

A. Electron Wave Transmission and Reflection At a Potential Energy Step:

The equation describing the equivalent of Snell's law for electron wave transmission and reflection at a potential energy step are derived under the following assumptions: (1) the phase of the transmitted electron wave at the potential energy barrier must be identical to that of the incident electron wave, i.e., this requirement of continuity of instantaneous phase at a boundary is commonly referred to as "phase matching"; (2) the phase of the reflected wave must also be phase matched to the incident wave; and (3) the kinetic energy of a reflected electron wave is the same as that of an incident electron wave, i.e., this requirement of energy conservation implies that the angle of reflection is equal to the angle of incidence.

Define the following quantities:
E = the total energy of an electron incident upon a potential energy barrier of height $V_B$
$k_i$ = the magnitude of the incident electron wavevector
$k_i = (2m_1^*E)^{\frac{1}{2}}$ $m^* = m_1$ is the electron effective mass of the incident electron and $m_2$ is the electron mass of the transmitted electron $h$ = Planck's constant divided by $2\pi$ $E - V_B$ the kinetic energy of a transmitted electon $k_t$ = the magnitude of the transmitted electron wavevector $k_t = [2m_2I(E-V_B)]^{\frac{1}{2}}$ @$_i$ = the angle of incidence @$_t$ = the angle of transmittance Using the above-stated assumptions and definitions to derive the equivalent of Snell's law for electrons provides, in terms of the electron energies, that:

$$(AI\text{-}1) \quad \sin@_t/\sin@_i = k_i/k_t$$

The equation describing the transmitted and reflected electron wave amplitudes at a potential energy step are derived under the following assumptions: (1) the wave functions are continuous across the potential energy barrier and (2) the probability current density normal to the potential energy boundary is conserved.

Define the following quantities:

$r_0$ = the electron amplitude reflectivity at the potential energy barrier $t_O$ = the electron amplitude transmissivity at the potential energy barrier Using the above-stated assumptions ans definitions to derive expressions for $r_0$ and $t_0$ provides:

$$t_0 = \frac{2(E/m_1^*)^{\frac{1}{2}}\cos@_i}{(E/m_1^*)^{\frac{1}{2}}\cos@_i + [(E-V_B)/m_2^*]^{\frac{1}{2}}\cos@_t} \quad (AI\text{-}2)$$

$$r_0 = \frac{(E/m_1^*)^{\frac{1}{2}}\cos@_i - [(E-V_B)/m_2^*]^{\frac{1}{2}}\cos@_t}{(E/m_1^*)^{\frac{1}{2}}\cos@_i + [(E-V_B)/m_2^*]^{\frac{1}{2}}\cos@_t} \quad (AI\text{-}3)$$

B. Optical Transmission and Reflection At a Boundary Between Two Dielectrics In order to provide the comparison between quantum mechanical electron wave transmission and reflection at a potential barrier with the electromagnetic optical wave transmission and reflection at a boundary between dielectrics, we provide the following well known equations from optics:

$$\sin@_t/\sin@_i = n_1/n_2 \quad (AI\text{-}4)$$

$$t_0 = \frac{2n_1\cos@_i}{n_1\cos@_i + n_2\cos@_t} \quad (AI\text{-}5)$$

$$r_0 = \frac{n_1\cos@_i - n_2\cos@_t}{n_1\cos@_i + n_2\cos@_t} \quad (AI\text{-}6)$$

Comparing equation (AI-1) with equation (AI-4) and comparing equations (AI-2) and (AI-3) with equations (AI-4) and (AI-5), We have determined that the two physical systems can be treated analogously by making the following inventive mappings:

(AI-7) $n_e$(phase) is proportional to $[m^*(E-V)]^{\frac{1}{2}}$ (AI-8) $n_3$(amplitude) is proportional to $[(E-V)/m^*]^{\frac{1}{2}}$

APPENDIX II

The following illustrates the manner in which the design of electromagnetic optical wave devices is mapped into the design of solid state quantum mechanical electron wave devices.

Using the mapping between quantum mechanical electron waves and electromagnetic optical waves set forth in Appendix I, in accordance with the present invention, the characteristics of a many-boundary solid state superlattice system can be determined by directly applying the techniques used in electromagnetics to design devices such as interference filters and, in particular, by applying the chain matrix design approach which is well known to those of ordinary skill in the art.

The manner in which this occurs is illustrated as follows. Consider a solid state superlattice structure comprised of M layers which is bounded on one side by an input medium designated as layer 0 and which is bounded on the other side by an output medium designated as layer M+1. In layer m-1 of the superlattice, the amplitude of an electron wave which is traveling in the positive direction and which is incident upon upon layer m is designated as $U_{i,m}$. In layer m-1, the amplitude of the electron wave which is traveling in the negative direction and which is reflected from layer m is designated as $U_{r,m}$. These complex wave amplitudes may be expressed in terms of corresponding amplitudes $U_{i,m+1}$ and $U_{r,m+1}$ which are incident upon and reflected from the boundary between layers m and m+1 as follows:

$$\begin{bmatrix} U_{i,m} \\ U_{r,m} \end{bmatrix} = \frac{1}{t_{e,m}} \begin{bmatrix} 1 & r_{e,m} \\ r_{e,m} & 1 \end{bmatrix} \begin{bmatrix} \exp(jk_{e,m}d_m\cos@_m) & 0 \\ 0 & \exp(-jk_{e,m}d_m\cos@_m) \end{bmatrix} \begin{bmatrix} U_{i,m+1} \\ U_{r,m+1} \end{bmatrix} \quad (AII\text{-}1)$$

where $t_{e,m}$ is the amplitude transmissivity of the interface between layers m-1 and m, $r_{e,m}$ is the amplitude reflectivity at the same interface, $k_{e,m}$ is the magnitude of the electron wavevector in layer m given in Appendix I, is the thickness of layer m, and @m is the angle of the wavevector direction in layer m. For a superlattice comprised of M layers, the total normalized transmitted electron wave amplitude $U_{t,M+1}$ in output layer M+1 and the total normalized reflected electron wave amplitude $U_{r,O}$ in input layer 0 are obtained by chain multiplying a total of M+1 versions of equation AII-1 together for each one of the M layers and one for the output layer. The result is:

$$\begin{bmatrix} 1 \\ U_{r,0} \end{bmatrix} = \prod_{m=1}^{M} \frac{1}{t_{e,m}} \begin{bmatrix} 1 & r_{e,m} \\ r_{e,m} & 1 \end{bmatrix} \begin{bmatrix} \exp(jk_{e,m}d_m\cos@_m) & 0 \\ 0 & \exp(-jk_{e,m}d_m\cos@_m) \end{bmatrix} \times$$

$$\frac{1}{t_{e,m}} \begin{bmatrix} 1 & r_{e,M+1} \\ r_{e,M+1} & 1 \end{bmatrix} \begin{bmatrix} U_{t,m+1} \\ 0 \end{bmatrix} \quad (AII\text{-}2)$$

and this can be solved directly for the electron wave amplitude transmissivity $U_{t,M+1}$ and the electron wave amplitude reflectivity $U_{r,0}$.

Equations of the form of equations AII-1 and AII-2 have been widely used over many years for the design of thin film optical coatings and filters. Types of devices that have been treated and for which extensive designs exist include low pass filters, high pass filters, notch filters (narrow band and wide band), impedance transformers (antireflection coatings), and high reflectance surfaces (dielectric mirrors).

What is claimed is:

1. A solid state quantum mechanical electron wave device comprising a superlattice structure which is comprised of a multiplicity of adjacent layers of semiconductor material, each of which layers has a potential energy barrier and supports substantially ballistic electron transport at energies above the potential energy barrier of the layer.

2. The solid state quantum mechanical electron wave device of claim 1 wherein teh potential energy barriers, electron effective masses, and thicknesses of the layers of teh superlattice structure are predetermined so that the device provides a predetermined transmissivity for electorns having kinetic energies in a predetermined range.

3. The device of claim 1 wherein the potential energy barriers, electron effective masses, and thicknesses of the layers of teh superlattice structure are predetermined so that the device provides a predetermined reflectivity for electrons having kinetic energies in a predetermined range.

4. The device of claim 3 wherein the potential energy barriers, electron effective masses, and thicknesses of the layers of the superlattice structure have values which are determined by predetermined analogy to values of optical indices of refraction and thicknesses of layers of an optical wave device comprised of a multiplicity of adjacent layers of dielectric material which provides an optical reflectivity for electromagnetic optical waves which is substantially similar to the predetermined reflectivity for electrons.

5. The device of claim 3 wherein at least one of the layers has a thickness which is substantially equal to an integral multiple of an electron quarter-wavelength in the material comprising the layer for electrons having kinetic energies in the predetermined range.

6. The device of claim 5 wherein the material of the layers alternates between a first semiconductor material and a second semiconductor material.

7. The device of claim 1 wherein at least one layer of the superlattice structre is comprised of a material selected from binary, ternary and quaternary semiconductor compositions.

8. The device of claim 5 wherein a first end of the superlattice structure is adjacent a layer of semiconductor material having a first predetermined conduction band height and the other end of the superlattice structure is adjacent a layer of semiconductor material having a second predetermined conduction band height.

9. A solid state quantum mechanical electron wave device for guiding electrons which comprises a semiconductor layer disposed betwen a first and a second superlattice structure, each of which superlattice structures is comprised of a multiplicity of adjacent layers of semiconductor material, each of which layers has a potential energy barrier and supports substantially ballistic electronc transport at energies above the potential energy barrier of the layer and each of which superlattice structures substantially totally reflects electrons having kinetic energy in a predetermined range.

10. A solid state quantum mechanical hole wave device comprisigna superlattice structure which is comprised of a multiplicity of adjacent layers of semiconductor material, each of which layers has a potential energy barrier and supports substantially ballistic hole transport at energies above the potential energy barrier of the layer.

11. The device of claim 2 wherein teh potential energy barriers, effective masses, and thicknesses of the layers of the superlattice structure have values which are determined by predetermined analogy to values of optical indices of refraction and thicknesses of layers of an optical wave device comprised of a multiplicity of adjacent layers of dielectric material which provides an optical transmissivity for electromagnetic optical waves wh ich is substantially similar to the predetermined transmissivity for electrons.

12. The device of claim 1 wherein at least one of the layers has a thickness which is substantially equal to an integral multiple of an electron quarter-wavelength in the material comprising the layer for electrons having kinetic energies in teh predetermined range.

13. The device of claim 12 wherien the material of the layers alternates between a first semiconductor material and a second semiconductor material.

14. The device of claim 12 wherein a first end of the superlattice structure is adjacent a layer of semiconductor material having a first predetermined conduction band height and the other end of the superlattice structure is adjacent a layer of semiconductor material having a second predetermined conduction band height.

15. The device of claim 1 wherein at least one of the layers has a thickness which is substantially equal to an integral multiple of an electron quafter-wavelength in the material comprising the layer for electrons having kinetic energies in a predetermined range.

16. The device of claim 14 wherein at least one of the layers has a thickness which is substantially equal to an integral multiple of a hole quarter-wavelength in the material comprising the layer for holes having kinetic energies in a predetermined range.

* * * * *

UNITED STATES PATENT AND TRADEMARK OFFICE
CERTIFICATE OF CORRECTION

PATENT NO. : 4,985,737      Page 1 of 15
DATED : January 15, 1991
INVENTOR(S) : Thomas K. Gaylord, et al.

It is certified that error appears in the above-indentified patent and that said Letters Patent is hereby corrected as shown below:

col. 1, line 5    "DAAL03-897-1-K-0059" should be "DAAL03-87-K-0059"
col. 1, line 13   "mechanicaI" should be "mechanical" (substitute "l" for "I")
col. 1, line 20   "particuIarly" should be "particularly" (substitute "l" for "I"
col. 1, line 24   "controI" should be "control" (substitute "l" for "I")
col. 1, line 24   "successiveIy" should be "successively" (substitute "l" for "I")
col. 1, line 26   "materiaIs" should be "materials" (substitute "l" for "I")
col. 1, line 26   "1-x" should be a subscript.
col. 1, line 31   "muItiple" should be "multiple" (substitute "l" for "I")
col. 1, line 41   "tunneIing" should be "tunneling"
col. 1, line 48   "GaAs/AIGaAs" should be "GaAs/AlGaAs" (substitute "l" for "I")
col. 1, line 53   "discIose" should be "disclose" (substitute "l" for "I")
col. 1, line 60   "SpecificaIly" should be "Specifically" (substitute "l" for "I")
col. 1, line 63   "eIectrons" should be "electrons" (substitute "l" for "I")
col. 1, line 68   "baIIistic" should be "ballistic" (substitute "l" for "I")

Column 2 col. 2, line 6    "100 Angstroms (A)" should be "10 nanometers (nm)"
col. 2, line 7    "eIectrons" should be "electrons" (substitute "l" for "I")
col. 2, line 10   "baIIistic" should be "ballistic" (substitute "l" for "I")
col. 2, line 11   "Iayer" should be "layer" (substitute "l" for "I")
col. 2, line 12   "Iayers" should be "layers" (substitute "l" for "I")
col. 2, line 12   "aIIoy" should be "alloy" (substitute "l" for "I")
col. 2, line 12   "AIGaAs" should be "AlGaAs" (substitute "l" for "I")
col. 2, line 13   "AIGaAs" should be "AlGaAs" (substitute "l" for "I")
col. 2, line 13   "materiaI" should be "material" (substitute "l" for "I")
col. 2, line 14   "Iattice" should be "lattice" (substitute "l" for "I")

UNITED STATES PATENT AND TRADEMARK OFFICE
CERTIFICATE OF CORRECTION

PATENT NO. : 4,985,737
DATED : January 15, 1991
INVENTOR(S) : Thomas K. Gaylord, et al It is certified that error appears in the above-indentified patent and that said Letters Patent is hereby corrected as shown below:

col. 2, line 17 "aIso" should be "also" (substitute "l" for "I")
col. 2, line 18 "eIectron" should be "electron" (substitute "l" for "I")
col. 2, line 24 "fiIters" should be "filters" (substitute "l" for "I")
col. 2, line 31 "aboveidentified" should be "above-identified"
col. 2, line 37 "ballistiO electrOn" should be "ballistic electron"
col. 2, line 42 "opticaI" should be "optical" (substitute "l" for "I")
col. 2, line 58 "opticaI" should be "optical" (substitute "l" for "I")
col. 2, line 65 "kinetic energy kinetic energy" should be "kinetic energy"
col. 2, line 68 "eIectron" should be "electron" (substitute "l" for "I").

Column 3 col. 3, line 1 "foIIowing" should be "following" (substitute "l" for "I")
col. 3, line 3 "$-[2m^*(E - V)]^{\frac{1}{2}}$" should be "$k = [2m^*(E - V)]^{\frac{1}{2}}/\hbar$"
col. 3, line 6 "teh" should be "the"
col. 3, line 8 "n3" should be "$n_e$"
col. 3, line 8 "-" should be "$\alpha$" ("proportional to" symbol.)
col. 3, line 8 There should be a space before and after "$\alpha$"
col. 3, line 8 "mI" should be "$m^*$"
col. 3, line 13 "skiII" should be "skill" (substitute "l" for "I")
col. 3, line 26 "ballistiO" should be "ballistic"
col. 3, line 34 "wiII" should be "will" (substitute "l" for "I")
col. 3, line 38 "it pre-" should be "it is pre-"
col. 3, line 39 "excIude" should be "exclude" (substitute "l" for "I")
col. 3, line 46 "substantiaIIy" should be "substantially" (substitute "l" for "I")
col. 3, line 47 "multiIayer superIattices" should be "multilayer superlattices" (substitute "l" for "I")
col. 3, line 48 "substantiaIIy" should be "substantially" (substitute "l" for "I")
col. 3, line 57 "wav" should be "wave"
col. 3, line 64 "eIectron" should be "electron" (substitute "l" for "I")
col. 3, line 65 "dieIectrics" should be "dielectrics" (substitute "l" for "I")
col. 3, line 66 "filt er" should be "filter"

UNITED STATES PATENT AND TRADEMARK OFFICE
CERTIFICATE OF CORRECTION

Page 3 of 15

PATENT NO. : 4,985,737
DATED : January 15, 1991
INVENTOR(S) : Thomas K. Gaylord, et al It is certified that error appears in the above-indentified patent and that said Letters Patent is hereby corrected as shown below:

Column 4 col. 4, line 2  "avaiIabIe" should be "available" (substitute "l" for "I")
col. 4, line 3  "anaIogous" should be "analogous" (substitute "l" for "I")
col. 4, line 3  "superIat-" should be "superlat-" (substitute "l" for "I")
col. 4, line 4  "wiII" should be "will" (substitute "l" for "I")
col. 4, line 5  "IaYers" should be "layers"
col. 4, line 8  "Iimits" should be "limits" (substitute "l" for "I")
col. 4, line 9  "usabIe" should be "usable" (substitute "l" for "I")
col. 4, line 9  "materiaIs" should be "materials" (substitute "l" for "I")
col. 4, line 11 "precIudes" should be "precludes" (substitute "l" for "I")
col. 4, line 13 "skiII" should be "skill" (substitute "l" for "I")
col. 4, line 24 "AIGaAs" should be "AlGaAs"
col. 4, line 30 "superlat" should be "superlat-" (Add hyphen.)
col. 4, line 38 "opticaI" should be "optical" (substitute "l" for "I")
col. 4, line 44 "nume-raIs" should be "numerals" (substitute "l" for "I")
col. 4, line 49 "superIattice" should be "superlattice" (substitute "l" for "I")
col. 4, line 55 "Iayer" should be "layer" (substitute "l" for "I")
col. 4, line 56 "Iayers" should be "layers" (substitute "l" for "I")
col. 4, line 59 "Iayers" should be "layers" (substitute "l" for "I")

Column 5 col. 5, line 3  The subscript "055" should be "0.55"
col. 5, line 3  "SuperIattice" should be "Superlattice" (substitute "l" for "I")
col. 5, line 15 "16.9599 A" should be "1.69599 nm"
col. 5, line 16 "Iayers" should be "layers" (substitute "l" for "I")
col. 5, line 17 "monoIayers" should be "monolayers" (substitute "l" for "I")
col. 5, line 17 "25.4398 A" should be "2.54398 nm"
col. 5, line 18-19 "Ga0.55Al0.45As" should be "$Ga_{0.55}Al_{0.45}As$"

UNITED STATES PATENT AND TRADEMARK OFFICE
CERTIFICATE OF CORRECTION

PATENT NO. : 4,985,737

DATED : January 15, 1991

INVENTOR(S) : Thomas K. Gaylord, et al

Page 4 of 15

It is certified that error appears in the above-indentified patent and that said Letters Patent is hereby corrected as shown below:

| | |
|---|---|
| col. 5, line 19 | "2.82665 A" should be "0.282665 nm" |
| col. 5, line 38 | "transIate" should be "translate" |
| col. 5, line 43 | "proportionaI" should be "proportional" (substitute "l" for "I") |
| col. 5, line 47 | "proportionaI" should be "proportional" (substitute "l" for "I") |
| col. 5, line 54 | "eIectrons" should be "electrons" (substitute "l" for "I") |
| col. 5, line 59 | "baIIistic" should be "ballistic" |
| col. 5, line 64 | "mate-riaIs" should be "mate-rials" (substitute "l" for "I") |
| col. 5, line 65 | "wiII" should be "will" (substitute "l" for "I") |

Column 6

| | |
|---|---|
| col. 6, line 18 | "mechanicaI" should be "mechanical" (substitute "l" for "I") |
| col. 6, line 19 | "eIectron" should be "electron" (substitute "l" for "I") |
| col. 6, line 19 | "opticaI" should be "optical" (substitute "l" for "I") |
| col. 6, line 26 | "eIectron" should be "electron" (substitute "l" for "I") |
| col. 6, line 51 | "particuIar" should be "particular" (substitute "l" for "I") |
| col. 6, line 56 | "aII" should be "all" (substitute "l" for "I") |
| col. 6, line 57 | "appIy" should be "apply" (substitute "l" for "I") |
| col. 6, line 60 | "mechanicaI" should be "mechanical" (substitute "l" for "I") |
| col. 6, line 62 | "refleotion" should be "reflection" |
| col. 6, line 65 | "anaIyzed" should be "analyzed" (substitute "l" for "I") |

UNITED STATES PATENT AND TRADEMARK OFFICE
CERTIFICATE OF CORRECTION

PATENT NO. : 4,985,737

DATED : January 15, 1991

INVENTOR(S) : Thomas K. Gaylord, et al

It is certified that error appears in the above-indentified patent and that said Letters Patent is hereby corrected as shown below:

<u>Column 7</u> col. 7, line 1   "mechanicaI" should be "mechanical" (substitute "l" for "I")
col. 7, line 2   "eIectron" should be "electron" (substitute "l" for "I")
col. 7, line 7   "eIectric" should be "electric" (substitute "l" for "I")
col. 7, line 12  "folIows" should be "follows" (substitute "l" for "I")
col. 7, line 14  "eleOtron" should be "electron"
col. 7, line 15  "¼ should be a superscript.
col. 7, line 17  "178" should be "¼"
col. 7, line 22  "fiIters" should be "filters" (substitute "l" for "I")
col. 7, line 23  "fiIm" should be "film" (substitute "l" for "I")
col. 7, line 32  "aII" should be "all" (substitute "l" for "I")
col. 7, line 39  "Iow" should be "low" (substitute "l" for "I")
col. 7, line 41  "refIectances" should be "reflectances" (substitute "l" for "I")
col. 7, line 41  "Iayers" should be "layers" (substitute "l" for "I")
col. 7, line 43  "wavelength" should be "wavelength" (substitute "l" for "I")
col. 7, line 43  "Iayer" should be "layer" (substitute "l" for "I")
col. 7, line 47  "optical literature" should be "optical literature" (substitute "l" for "I")
col. 7, line 47  "symboIically" should be "symbolically" (substitute "l" for "I")
col. 7, line 57  Remove period after "analogous"
col. 7, line 60  "halfwavelength" should be "half-wavelength"
col. 7, line 61  "refIected" should be "reflected" (substitute "l" for "I")
col. 7, line 63  "materiaIs" should be "materials" (substitute "l" for "I")
col. 7, line 63  "wiII" should be "will" (substitute "l" for "I")
col. 7, line 65  "Iayers" should be "layers" (substitute "l" for "I")
col. 7, line 68  "reciprocaI" should be "reciprocal" (substitute "l" for "I")

UNITED STATES PATENT AND TRADEMARK OFFICE
CERTIFICATE OF CORRECTION

PATENT NO. : 4,985,737

DATED : January 15, 1991

INVENTOR(S) : Thomas K. Gaylord, et al

Page 6 of 15

It is certified that error appears in the above-indentified patent and that said Letters Patent is hereby corrected as shown below:

<u>Column 8</u> col. 8, line 2    "fiIter" should be "filter" (substitute "l" for "I")
col. 8, line 7    "originaI" should be "original" (substitute "l" for "I")
col. 8, line 17   "skiII" should be "skill" (substitute "l" for "I")
col. 8, line 18   "Ihe" should be "The"
col. 8, line 20   "waveIength" should be "wavelength" (substitute "l" for "I")
col. 8, line 23   "waveIength" should be "wavelength" (substitute "l" for "I")
col. 8, line 29   "eIectron" should be "electron" (substitute "l" for "I")
col. 8, line 29   "inventiv" should be "inventive"
col. 8, line 30   "wave vector" should be "wavevector" (one word)
col. 8, line 33   "refIectivity" should be "reflectivity" (substitute "l" for "I")
col. 8, line 35   "folIowing" should be "following" (substitute "l" for "I")
col. 8, line 37   "fiIm" should be "film" (substitute "l" for "I")
col. 8, line 38   "FiIms" should be "Films" (substitute "l" for "I")
col. 8, line 49   "Iow" should be "low" (substitute "l" for "I")
col. 8, line 51   "half-Wavelength" should be "half-wavelength" (Change to lower case w.)
col. 8, line 53   "um" should be "$\mu$m"
col. 8, line 54   "opticaI" should be "optical" (substitute "l" for "I")
col. 8, Table I   "um" should be "$\mu$m"
                  "(A)" should be "(nm)"
                  "625.000" should be "62.5000"
                  "1851.852" should be "185.1852"
                  "1366.120" should be "136.6120"

UNITED STATES PATENT AND TRADEMARK OFFICE
CERTIFICATE OF CORRECTION

PATENT NO. : 4,985,737
DATED : January 15, 1991
INVENTOR(S) : Thomas K. Gaylord, et al It is certified that error appears in the above-indentified patent and that said Letters Patent is hereby corrected as shown below:

<u>Column 9</u> col. 9, line 6  "lam" should be "$\lambda$"
col. 9, eqn. (1) "lam" should be "$\lambda$"
col. 9, eqn. (2) "−" should be "D −"
col. 9, line 20 "vaIue" should be "value"
col. 9, eqn. (3) Leave a blank line before the equation.
col. 9, eqn. (4) "$d_m$h" should be "$d_m$ − h"
col. 9, eqn. (4) Leave a blank line after the equation.
col. 9, line 33 "eIectron" should be "electron" (substitute "l" for "I")
col. 9, line 35 "100 A" should be "10.0 nm"
col. 9, line 37 "simpIicity the eIectron" should be "simplicity the electron"
col. 9, Table II "100 A" should be "10 nm"
              "(A)" should be "(nm)
              "6.25000" should be "0.625000"
              "18.51852" should be "1.851852"
              "13.66120" should be "1.366120"
col. 9, line 54 "superIat-tice" should be "superlat-tice" (substitute "l" for "I")
col. 9, line 55 "Iess than monoIayer" should be "less than monolayer" (substitute "l" for "I")
col. 9, line 58 "wiII" should be "will" (substitute "l" for "I")
col. 9, line 59 "fiIter" should be "filter" (substitute "l" for "I")
col. 9, line 63 "soIid" should be "solid" (substitute "l" for "I")

UNITED STATES PATENT AND TRADEMARK OFFICE
CERTIFICATE OF CORRECTION

PATENT NO. : 4,985,737

DATED : January 15, 1991

INVENTOR(S) : Thomas K. Gaylord, et al

It is certified that error appears in the above-indentified patent and that said Letters Patent is hereby corrected as shown below:

Column 10 col. 10, line 5 "mereIy by mechanicaIIy" should be "merely by mechanically" (substitute "l" for "I")

col. 10, line 6 "angIe" should be "angle" (substitute "l" for "I")

col. 10, line 13,14 "$Ga_{0.5}-5Al_{0.45}As$" should not be divided. "$Ga_{0.5}-5Al_{0.45}As$" should be "$Ga_{0.55}Al_{0.45}As$"

col. 10, line 18 "010435" should be "0.10435" (Add decimal point.)

col. 10, line 20 "$Ga_{0.55}Al_{0.-45}As$" should not be divided.

"$Ga_{0.55}Al_{0.-45}As$" should be "$Ga_{0.55}Al_{0.45}As$"

col. 10, line 22 "2.82665 A" should be "0.282665 nm"
col. 10, line 24 "16.9599 A" should be "1.69599 nm"
col. 10, line 25 "25.4398 A" should be "2.5498 nm"
col. 10, line 26,26 "101.652 A" should be "10.1652 nm"
col. 10, line 38 "materiaI" should be "material"
col. 10, line 39 "monoIayers" should be "monolayers" (substitute "l" for "I")
col. 10, line 45 "abovedescribed" should be "above-described"
col. 10, line 50 "FWH" should be "FWHM"
col. 10, line 54 "sho-uId" should be "should"
col. 10, line 54 "should" should not be divided.
col. 10, line 56 "Iayers" should be "layers" (substitute "l" for "I")
col. 10, line 61 "soIid" should be "solid" (substitute "l" for "I")

UNITED STATES PATENT AND TRADEMARK OFFICE
CERTIFICATE OF CORRECTION

PATENT NO. : 4,985,737
DATED : January 15, 1991
INVENTOR(S) : Thomas K. Gaylord, et al It is certified that error appears in the above-indentified patent and that said Letters Patent is hereby corrected as shown below:

Column 11 col. 11, line 10 "principal" should be "principle"
col. 11, line 11 "materIals" should be "materials" (substitute "l" for "I")
col. 11, line 19 "materIals" should be "materials" (substitute "l" for "I")
col. 11, line 27 "eIectron potentiaI" should be "electron potential" (substitute "l" for "I")
col. 11, line 26 There should be a period after "$x_2$"
col. 11, line 28 "energY" should be "energy" (substitute "l" for "I")
col. 11, eqn. (5) "del" should be "$\Delta$"
"Axi-0,1,2" should be divided so that it is "$Ax_i$  i-0,1,2" (Subscript i has also been added.)
col. 11, line 34 "del" should be "$\Delta$"
col. 11, eqn. (6) "m - (B + $Cx_i$)" should be "$m_i^*$ - (B + $Cx_i$)" (add subscript i and superscript *)

col. 11, eqn. (6) "$m_0$-0,1,2" should be "$m_0$  i-0,1,2" (Add i and separate.)

col. 11, line 42 "$m_i$I" should be "$m_i^*$"

col. 11, line 42 "$lam_i^2$" should be "$\lambda_{\bullet,i}^2$"

col. 11, line 43 "fiIter" should be "filter" (substitute "l" for "I")
col. 11, line 44 "Ep" should be "$E_p$"

col. 11, eqn. (7) "$2_i^*(lam_p)_i^2$ i-0,1,2" should be "$2m_i^*(\lambda_p)_i^2$  i-0,1,2"

col. 11, line 48 "$(lam_p)_i$" should be "$(\lambda_p)_i$"

col. 11, line 54 "waveIength" should be "wavelength" (substitute "l" for "I")

UNITED STATES PATENT AND TRADEMARK OFFICE
CERTIFICATE OF CORRECTION

PATENT NO. : 4,985,737
DATED : January 15, 1991
INVENTOR(S) : Thomas K. Gaylord, et al It is certified that error appears in the above-indentified patent and that said Letters Patent is hereby corrected as shown below:

col. 11, eqn. (8) "$(lam_p)_i$" should be "$(\lambda_p)_i$"

"$BE_{p})^{1-/2}$" should be "$BE_p))^{\frac{1}{2}}$" ("$))$" should not be subscripts)

($\frac{1}{2}$ should not be divided.)

"$/2i=0,1,2$" should be "$i=0,1,2$"

col. 11, line 61 "aIso" should be "also" (substitute "l" for "I")

col. 11, eqn. (9) "$(lam)_i$" should be "$(\lambda_p)_i$" (Change to Greek letter lambda and add subsript "p")

col. 11, eqn. (9) "/4i=1,2" should be "/4 i=1,2" (Add spaces)

col. 11, line 67 "monoIayers" should be "monolayers" (substitute "l" for "I")

Column 12 col. 12, line 1 "foIIowing" should be "following" (substitute "l" for "I")

col. 12, eqn. (10) Eliminate the dot in "]·" so that it is just "}"

col. 12, line 11 "materiaI" should be "material" (substitute "l" for "I")

col. 12, line 12 "produces $_1$" should be "produces $x_1$"

col. 12, line 14 "Iayer" should be "layer" (substitute "l" for "I")

col. 12, line 15 "wiII" should be "will" (substitute "l" for "I")

col. 12, line 16 "mate-riaI" should be "material" (substitute "l" for "I")

col. 12, line 17 "monoIayers" should be "monolayers" (substitute "l" for "I")

col. 12, line 18 "Iayer" should be "layer" (substitute "l" for "I")

col. 12, line 28 "integerq$_i$" should be "integer q$_i$"

col. 12, line 31 "$x_L$" should be "$x_1$" (The subscript should be one rather than L.)

col. 12, line 34 "eIectron" should be "electron" (substitute "l" for "I")

col. 12, line 42 $r=r_1=r_2=2.282665$ A" should be "$r=r_1=r_2=0.282665$ nm" (A two has been eliminated from the number and the units have changed.)

UNITED STATES PATENT AND TRADEMARK OFFICE
CERTIFICATE OF CORRECTION

PATENT NO. : 4,985,737

DATED : January 15, 1991

INVENTOR(S) : Thomas K. Gaylord, et al

It is certified that error appears in the above-indentified patent and that said Letters Patent is hereby corrected as shown below:

col. 12, line 49    "fIlter" should be "filter" (substitute "l" for "I")

col. 12, line 52    "$x_{0-xmax}-0.45$" should be "$x_0-x_{max}-0.45$"

col. 12, line 52    "0.347913" should be "0.347913 eV" (Add "eV")

col. 12, line 55    "reaI" should be "real" (substitute "l" for "I")

col. 12, line 57    "$x_L$" should be "$x_1$" (The subscript should be one rather than L.)

col. 12, line 58    "$p_L$" should be "$p_1$"

col. 12, line 61    "19.8766 A" should be "1.98766 nm"

col. 12, line 63    "d2-p2r-16.9599 A" should be "$d_2-p_2r-1.69599$ nm" (The two has been converted to a subscript and the units of the number have been changed.)

col. 12, line 65    "$m_0-0.10435m_0$" should be "$m_0^*-0.10435m_0$"

col. 12, line 65    "$m_1-0.084126m_{00}$" should be "$m_1^*-0.084126m_0$"

col. 12, line 67    "Ep-Vl" should be "$E_p-V_1$"

Column 13 col. 13, line 2    "$n_e$(amplitude)l" should be "$n_e$(amplitude)$_1$" (Make the 1 into a subscript.)

col. 13, line 8    "$Ga_{1-x}Al_xAs$" should not be divided.

col. 13, line 53    "teh" should be "the"

col. 13, line 59    "eIectron" should be "electron" (substitute "l" for "I")

col. 13, line 64    "ex$_i$sting" should be "existing"

UNITED STATES PATENT AND TRADEMARK OFFICE
CERTIFICATE OF CORRECTION

PATENT NO. : 4,985,737

DATED : January 15, 1991

INVENTOR(S) : Thomas K. Gaylord, et al

It is certified that error appears in the above-indentified patent and that said Letters Patent is hereby corrected as shown below:

Column 14 col. 14, line 4   "max$_i$mally" should be "maximally"
col. 14, line 11   "contolling" should be "controling"
col. 14, line 17   "Iayer" should be "layer" (substitute "l" for "I")
col. 14, line 20   "refIection" should be "reflection" (substitute "l" for "I")
col. 14, line 21   "nomencIature" should be "nomenclature" (substitute "l" for "I")
col. 14, line 21   "cIear" should be "clear" (substitute "l" for "I")
col. 14, line 22   "eIectron" should be "electron" (substitute "l" for "I")
col. 14, line 27   "beIow" should be "below" (substitute "l" for "I")
col. 14, line 43   "opticaI" should be "optical" (substitute "l" for "I")
col. 14, line 52   "eIectron" should be "electron" (substitute "l" for "I")
col. 14, line 54   "eIectron" should be "electron" (substitute "l" for "I")
col. 14, line 62   "refIection" should be "reflection" (substitute "l" for "I")

col. 14, line 68   "$k_i = (2m_1{}^* E)^{\frac{1}{2}}$" should be "$k_i = (2m_1{}^* E)^{\frac{1}{2}}/\hbar$"

Column 15 col. 15, line 1   "$m^*$" should be "$m_1{}^*$"
col. 15, line 1   "$m_1 is$" should be "$m_1$ is" (Add a space between "$m_1$" and "is")
col. 15, line 2   "$m_2$" should be "$m_2{}^*$"
col. 15, line 4   "h" should be "$\hbar$"
col. 15, line 5   "$V_B$ the" should be "$V_B$ - the"
col. 15, line 5   "electon" should be "electron"

col. 15, line 8   "$k_t = (2m_2 I(E-V_B))^{\frac{1}{2}}$" should be "$k_t = [2m_2{}^*(E-V_B)]^{\frac{1}{2}}/\hbar$"

col. 15, line 9   "@" should be "$\beta$"
col. 15, line 10   "@" should be "$\beta$"
col. 15, line 13   "eIectron" should be "electron" (substitute "l" for "I")
col. 15, line 15   "(AI-1)" is the equation number and should be at the right-hand margin.

UNITED STATES PATENT AND TRADEMARK OFFICE
CERTIFICATE OF CORRECTION

PATENT NO. : 4,985,737

DATED : January 15, 1991

INVENTOR(S) : Thomas K. Gaylord, et. al.

Page 13 of 15

It is certified that error appears in the above-indentified patent and that said Letters Patent is hereby corrected as shown below:

col. 15, line 15  "@" should be "$\theta$"
col. 15, line 15  "$k_i/k_t$" should be "$k_i/k_t = [m_1^*E]^{\frac{1}{2}}/[m_2^*(E - V_B)]^{\frac{1}{2}}$"
col. 15, line 17  "ampIitudes" should be "amplitudes" (substitute "l" for "I")
col. 15, line 24  "$t_O$" should be "$t_0$"
col. 15, line 27  "ans" should be "and"
col. 15, eqn. (AI-2)  "@" should be "$\theta$" (3 places)
col. 15, eqn. (AI-3)  "@" should be "$\theta$" (4 places)
col. 15, eqn. (AI-4)  "@" should be "$\theta$" (2 places)
col. 15, eqn. (AI-5)  The "t" in "$t_0$" should be larger.
col. 15, eqn. (AI-5)  "@" should be "$\theta$" (3 places)
col. 15, eqn. (AI-6)  The "r" in "$r_0$" should be larger.
col. 15, eqn. (AI-6)  "@" should be "$\theta$" (4 places)
col. 15, line 56  "We" should be "we"
col. 15, line 59  "(AI-7)" is the equation number and should be at the right-hand margin.
col. 15, line 60  "(AI-8)" is the equation number and should be at the right-hand margin.
col. 15, line 60  "$n_3$" should be "$n_e$"
col. 15, line 60  "½" should be a superscript.
col. 15, line 63  "iIIustrates" should be "illustrates" (substitute "l" for "I")
col. 15, line 64  "opticaI" should be "optical" (substitute "l" for "I")

UNITED STATES PATENT AND TRADEMARK OFFICE
CERTIFICATE OF CORRECTION

PATENT NO. : 4,985,737

DATED : January 15, 1991

INVENTOR(S) : Thomas K. Gaylord, et. al.

It is certified that error appears in the above-indentified patent and that said Letters Patent is hereby corrected as shown below:

Column 16 col. 16, line 3  "directIy" should be "directly" (substitute "l" for "I")
col. 16, line 4  "appIying" should be "applying" (substitute "l" for "I")
col. 16, line 7  "skiII" should be "skill" (substitute "l" for "I")
col. 16, line 23 "Iayers" should be "layers" (substitute "l" for "I")
col. 16, eqn. (AII-1) Adjust horizontal parts at top of brackets ([]) so that they are aligned with vertical parts.
col. 16, eqn. (AII-1) Add horizontal parts at bottom of brackets ([]) so that they are aligned with vertical parts.
col. 16, eqn. (AII-1) "@" should be "$\theta$" (2 places)
col. 16, line 37 "is the thickness" should be "$d_m$ is the thickness"
col. 16, line 37 "@" should be "$\theta$"
col. 16, line 37 "m" should be a subscript. (It should read "$\theta_m$")
col. 16, line 42 "$U_{r,O}$" should be "$U_{r,o}$" (Replace large O with small o.)
col. 16, line 43 "totaI" should be "total" (substitute "l" for "I")
col. 16, line 45 "Iayer" should be "layer" (substitute "l" for "I")
col. 16, eqn. (AII-2) Adjust horizontal parts at top of brackets ([]) so that they are aligned with vertical parts.
col. 16, eqn. (AII-2) Add horizontal parts at bottom of brackets ([]) so that they are aligned with vertical parts.
col. 16, eqn. (AII-2) "@" should be "$\theta$" (2 places)

col. 16, eqn. (AII-2) In third line of the equation "$c_{\bullet,m}$" should be "$c_{\bullet,M+1}$"
col. 16, eqn. (AII-2) In third line of the equation "$U_{1,m+1}$" should be "$U_{1,M+1}$"

UNITED STATES PATENT AND TRADEMARK OFFICE
CERTIFICATE OF CORRECTION

PATENT NO. : 4,985,737

DATED : January 15, 1991

INVENTOR(S) : Thomas K. Gaylord, et. al.

It is certified that error appears in the above-indentified patent and that said Letters Patent is hereby corrected as shown below:

Column 17 col. 17, line 9   "teh" should be "the"
col. 17, line 11  "teh" should be "the"
col. 17, line 13  "electorns" should be "electrons"
col. 17, line 17  "teh" should be "the"
col. 17, line 40  "structre" should be "structure"
col. 17, line 51  "betwen" should be "between"

Column 18 col. 18, line 5   "electronc" should be "electron"
col. 18, line 10  "comprisigna" ahould be "comprising a"
col. 18, line 16  "teh" should be "the"
col. 18, line 24  "wh ich" should be "which"
col. 18, line 31  "teh" should be "the"
col. 18, line 32  "wherien" should be "wherein"
col. 18, line 43  "quafter" should be "quarter"

Signed and Sealed this

Twenty-sixth Day of April, 1994

Attest:

BRUCE LEHMAN

*Attesting Officer*     *Commissioner of Patents and Trademarks*